(12) United States Patent
Kondo et al.

(10) Patent No.: US 7,728,899 B2
(45) Date of Patent: Jun. 1, 2010

(54) IMAGE SENSOR, AND IMAGE PICKUP APPARATUS USING SAME, AND MANUFACTURING METHOD FOR MANUFACTURING IMAGE SENSOR

(75) Inventors: Yasushi Kondo, Kyoto-fu (JP); Kunihiko Ohkubo, Kyoto-fu (JP)

(73) Assignee: Shimadzu Corporation, Kyoto (JP)

( * ) Notice: Subject to any disclaimer, the term of this patent is extended or adjusted under 35 U.S.C. 154(b) by 526 days.

(21) Appl. No.: 11/664,702

(22) PCT Filed: Oct. 3, 2005

(86) PCT No.: PCT/JP2005/018282

§ 371 (c)(1),
(2), (4) Date: Apr. 5, 2007

(87) PCT Pub. No.: WO2006/038583

PCT Pub. Date: Apr. 13, 2006

(65) Prior Publication Data
US 2007/0291149 A1    Dec. 20, 2007

(30) Foreign Application Priority Data
Oct. 7, 2004  (JP) .............................. 2004-295177

(51) Int. Cl.
*H04N 5/335*  (2006.01)
(52) U.S. Cl. ...................... 348/311; 348/315; 250/208.1
(58) Field of Classification Search ................. 348/303, 348/294, 311, 314–316; 377/58; 250/208.1; 257/222, 438
See application file for complete search history.

(56) References Cited

U.S. PATENT DOCUMENTS

| 5,557,121 | A * | 9/1996 | Kozuka et al. .............. 257/292 |
| 5,900,649 | A | 5/1999 | Effelsberg |
| 6,784,412 | B2 * | 8/2004 | Hynecek .................. 250/208.1 |
| 6,822,325 | B2 * | 11/2004 | Wong ......................... 257/717 |
| 2002/0126213 | A1 * | 9/2002 | Hynecek ..................... 348/241 |
| 2002/0191093 | A1 * | 12/2002 | Hynecek ..................... 348/311 |

(Continued)

FOREIGN PATENT DOCUMENTS

JP      59-056767      4/1984

(Continued)

OTHER PUBLICATIONS

Korean Patent Office Action for the Application No. 10-2007-7007174 dated Apr. 18, 2008.

(Continued)

*Primary Examiner*—Tuan Ho
(74) *Attorney, Agent, or Firm*—Cheng Law Group, PLLC

(57) ABSTRACT

A CCD type solid-state image sensor (CCD) and an image pickup apparatus of this invention have an image pickup unit and a charge multiplier mounted, as separated from each other, on a packaging board, thereby reducing an influence of one of the image pickup unit and the charge multiplier on the other. Consequently, an improvement in yield is realized. With the image pickup unit and the charge multiplier mounted, as separated from each other, on the packaging board, the CCD type solid-state image sensor (CCD) and the image pickup apparatus are highly versatile also when a design change is made in one of the image pickup unit and the charge multiplier.

18 Claims, 11 Drawing Sheets

U.S. PATENT DOCUMENTS

2003/0035057 A1* 2/2003 Hakamata et al. ........... 348/311
2004/0150737 A1* 8/2004 Pool et al. .................. 348/311
2006/0044430 A1* 3/2006 Mouli ........................ 348/294

FOREIGN PATENT DOCUMENTS

| | | |
|---|---|---|
| JP | 63-031378 | 2/1988 |
| JP | 63-221667 | 9/1988 |
| JP | 07-176721 | 7/1995 |
| JP | 10-304256 | 11/1998 |
| JP | 2002-330352 A | 11/2002 |
| JP | 2003-051510 | 2/2003 |
| JP | 2003-158679 | 5/2003 |

OTHER PUBLICATIONS

International Search Report for PCT/JP2005/018282 dated Jan. 10, 2006.

* cited by examiner (a)

(b)

(c)

IMAGE SENSOR, AND IMAGE PICKUP APPARATUS USING SAME, AND MANUFACTURING METHOD FOR MANUFACTURING IMAGE SENSOR

TECHNICAL FIELD

This invention relates to an image sensor having an image pickup device for picking up images based on incident light, and a charge-to-voltage conversion device for converting signal charges corresponding to intensity of the incident light into voltages, an image pickup apparatus using the same, and a manufacturing method for manufacturing the image sensor, and more particularly relates to a technique for multiplying the signal charges with a charge multiplying device disposed between the image pickup device and charge-to-voltage conversion device.

BACKGROUND ART

As this type of image sensor, there exist, for example, a CMOS (Complementary Metal Oxide Semiconductor) type solid-state image sensor for picking up images by converting incident light into voltages to generate and transfer voltages corresponding to the intensity of the light, and a CCD (Charge Coupled Device) type solid-state image sensor for converting incident light into electric charges to generate signal charges corresponding to the intensity of the light. The CCD type solid-state image sensor (hereinafter abbreviated as "CCD") will be described by way of example. As shown in FIG. 15, an FT (Frame Transfer) mode provides photogates 111 arranged two-dimensionally, and storage CCD cells 112 likewise arranged two-dimensionally. Each photogate 111 is constructed as a photoelectric converter for converting incident light into electric charges to generate signal charges corresponding to the intensity of the light. Each storage CCD cell 112 is constructed as a charge transfer unit for successively transferring the signal charges vertically as seen in the drawing of FIG. 15 to store the charges in an adjoining cell.

Horizontal transfer CCD cells 113 are arranged as connected downstream of the storage CCD cells 112 for transferring the transferred signal charges horizontally as seen in the drawing of FIG. 15. These photogates 111, storage CCD cells 112 and horizontal transfer CCD cells 113 constitute an image pickup unit 114. Further, a plurality of coupling CCD cells 115 are connected in order downstream of the horizontal transfer CCD cells 113. A charge multiplier 116 is connected downstream of the coupling CCD cells 115 for multiplying the signal charges transferred from the horizontal transfer CCD cells 113 through the coupling CCD cells 115. And a charge-to-voltage converter 117 is connected to the charge multiplier 116 for converting the multiplied signal charges into voltages. The charge multiplier 116 generates, for example, a high electric field region for charge multiplication to multiply the signal charges by passage through the high electric field region when transferring the signal charges (see Patent documents 1 and 2, for example). These image pickup unit 114, charge multiplier 116 and charge-to-voltage converter 117 are formed on the same board 110.

[Patent Document 1]
Unexamined Patent Publication H7-176721 (pages 3-7, FIGS. 1-11)

[Patent Document 2]
Unexamined Patent Publication H10-304256 (pages 4-5, FIGS. 1-4)

DISCLOSURE OF THE INVENTION

[Problem to be Solved by the Invention]

However, in the case of the image sensor having such construction, since the respective parts constituting the image sensor are formed on the same board as noted above, versatility is low when, for example, a design change is intended for either the image pickup unit or the charge multiplier. Particularly, of the parts constituting the image sensor, either one of the image pickup unit and the charge multiplier tends to influence the other. Thus, even without a design change, there is a possibility of yield becoming worse.

Further, the image pickup unit has an especially strong influence on the charge multiplier. To describe this concretely, charge multiplication gain varies greatly with the device temperature of the CCD or the temperature of the charge multiplier. Variations of the gain will worsen reproducibility of a photo image and reproducibility of a profile. Thus, it is necessary to stabilize the gain by carrying out temperature control to maintain constant the device temperature of the CCD or the temperature of the charge multiplier.

However, when performing high-speed photography at a photographing speed of $1.0 \times 10^6$ frames per second (1,000,000 frames per second), for example, the board is subjected to a remarkable temperature increase since the CCD is driven at high speed. It is therefore difficult to keep the temperature constant even if a cooling method such as a cooling mechanism (e.g. a coolant) or a cooling element (e.g. Peltier element) is used in order to prevent the temperature increase.

This invention has been made having regard to the state of the art noted above, and its object is to provide an image sensor having improved yield and high versatility, an image pickup apparatus using the same, and a manufacture method for manufacturing the image sensor.

[Means for Solving the Problem]

To fulfill the above object, this invention provides the following construction.

An image sensor of this invention is an image sensor for picking up images, comprising an image pickup device for picking up images based on incident light, a charge-to-voltage conversion device for converting signal charges corresponding to intensity of the incident light into voltages, and a charge multiplication device disposed between said image pickup device and said charge-to-voltage conversion device for multiplying the signal charges, characterized in that the image pickup device and said charge multiplication device are mounted as at least partly separated from each other on a board.

According to the image sensor of this invention, the image pickup device and the charge multiplication device are mounted, as at least partly separated from each other, on the board, thereby reducing an influence of one of the image pickup device and the charge multiplication device on the other. Consequently, an improvement in yield is realized. With the image pickup device and the charge multiplication device mounted, as at least partly separated from each other, on the board, the image sensor is highly versatile also when a design change is made in one of the image pickup device and the charge multiplication device.

In the invention described above, preferably, a heat isolation structure is provided for thermally separating the image pickup device and the charge multiplication device from each other. With such heat isolation structure, even when a temperature change occurs with the image pickup device, the heat isolation structure can reduce the influence of the image pickup device on the charge multiplication device.

One example of the image pickup device described above includes photoelectric conversion devices for converting the incident light into charges to generate signal charges corresponding to the intensity of the light, and charge transfer devices for transferring the signal charges generated from the photoelectric conversion devices.

Another example of the image pickup device is constructed for converting the incident light into voltages to generate voltages corresponding to the intensity of the light. In the case of the image pickup device constructed to generate voltages, the above voltages are transferred between the image pickup device and the charge multiplication device. A voltage-to-charge conversion device may be provided between the image pickup device and the charge multiplication device, the voltage-to-charge conversion device converting the transferred voltages into charges. After the conversion into charges, the charge multiplication device multiplies the signal charges, and the charge-to-voltage conversion device described above in the invention relating to the image sensor converts the signal charges into voltages.

In the case of the former example of the image pickup device including the photoelectric conversion devices and charge transfer devices, examples of transfer between the image pickup device and the charge multiplication device are as follows.

In one example of transfer, a charge detecting device is provided for detecting and outputting as voltages the signal charges generated from the photoelectric conversion devices, the above voltages being transferred between the image pickup device and the charge multiplication device. And a voltage-to-charge conversion device may be provided between the image pickup device and the charge multiplication device, the voltage-to-charge conversion device converting the transferred voltages into charges. After the conversion into charges, the charge multiplication device multiplies the signal charges, and the charge-to-voltage conversion device described above in the invention relating to the image sensor converts the signal charges into voltages.

In another example of transfer, the signal charges are transferred between the image pickup device and the charge multiplication device. The charge multiplication device multiplies the transferred signal charges, and the charge-to-voltage conversion device described above in the invention relating to the image sensor converts the signal charges into voltages. In this case, the transfer can be made in the same form (signal charges), without being converted until transfer to the charge-to-voltage conversion device.

An image pickup apparatus of this invention is an image pickup apparatus using an image sensor, characterized in that the image sensor comprises an image pickup device for picking up images based on incident light, a charge-to-voltage conversion device for converting signal charges corresponding to intensity of the incident light into voltages, and a charge multiplication device disposed between said image pickup device and said charge-to-voltage conversion device for multiplying the signal charges, the image pickup device and said charge multiplication device being mounted as at least partly separated from each other on a board.

According to the image pickup apparatus of this invention, the image pickup device and the charge multiplication device are mounted, as at least partly separated from each other, on the board. Consequently, an improvement in yield and a highly versatile image pickup apparatus are realized.

A manufacturing method for manufacturing an image sensor of this invention is a manufacturing method for manufacturing an image sensor having an image pickup device for picking up images based on incident light, and a charge-to-voltage conversion device for converting signal charges corresponding to intensity of the incident light into voltages, and having a charge multiplication device disposed between said image pickup device and said charge-to-voltage conversion device for multiplying the signal charges, characterized by laminating, on a first plate-like member, a second plate-like member for forming the image pickup device and the charge multiplication device, shaping said second plate-like member in a location corresponding to a part between the image pickup device and the charge multiplication device after the lamination to separate partly the image pickup device and said charge multiplication device, and laminating the first and second plate-like members after the shaping of the second plate-like member on a board for providing said sensor.

According to the manufacturing method for manufacturing an image sensor of this invention, on the first plate-like member, the second plate-like member for forming the image pickup device and the charge multiplication device is laminated. After the lamination, the second plate-like member is shaped in a location corresponding to a part between the image pickup device and the charge multiplication device to separate partly the image pickup device and said charge multiplication device. The first and second plate-like members after the shaping of the second plate-like member are laminated on the board for providing the sensor. The image sensor of this invention is realized by such manufacture method. The second plate-like member is shaped in the state where the second plate-like member is laminated on the first plate-like member. This can prevent damage done to the second plate-like member when the second plate-like member is laminated on the first plate-like member, compared with the case (invention relating to another manufacture method described hereinafter) where the first plate-like member is laminated after shaping the second plate-like member.

A manufacturing method for manufacturing an image sensor of this invention different from the above manufacturing method is a manufacturing method for manufacturing an image sensor having an image pickup device for picking up images based on incident light, and a charge-to-voltage conversion device for converting signal charges corresponding to intensity of the incident light into voltages, and having a charge multiplication device disposed between said image pickup device and said charge-to-voltage conversion device for multiplying the signal charges, characterized in that, before laminating, on a first plate-like member, a second plate-like member for forming the image pickup device and the charge multiplication device, said second plate-like member is shaped in a location corresponding to a part between the image pickup device and the charge multiplication device to separate partly the image pickup device and said charge multiplication device, laminating the shaped second plate-like member on said first plate-like member after the shaping of the second plate-like member, and laminating the first and second plate-like members after the lamination, on a board for providing said sensor.

According to the manufacturing method for manufacturing an image sensor of this invention, before laminating, on the first plate-like member, the second plate-like member for forming the image pickup device and the charge multiplication device, the second plate-like member is shaped in a location corresponding to a part between the image pickup device and the charge multiplication device to separate partly the image pickup device and said charge multiplication device. After the shaping of the second plate-like member, the shaped second plate-like member is laminated on the first plate-like member. The laminated first and second plate-like members are laminated on the board for providing said sensor. The image sensor of this invention is realized by such manufacture method.

In these manufacturing methods described above, preferably, the first plate-like member is a heat transfer substrate, with heat radiation members being formed in each of locations of the heat transfer substrate corresponding to the image pickup device and the charge multiplication device to be separated, to provide a heat isolation structure for thermally separating the image pickup device and the charge multiplication device from each other. Even when heat is generated in the second plate-like member in locations corresponding to the image pickup device and the charge multiplication device, the heat is released by the heat radiation members respectively through the heat transfer substrate which is the first plate-like member. Thus, this manufacturing method provides a heat isolation structure for thermally separating the image pickup device and the charge multiplication device, thereby realizing an image sensor with the above heat isolation structure.

EFFECTS OF THE INVENTION

With the image sensor and the image pickup apparatus using the same, according to this invention, the image pickup device and the charge multiplication device are mounted, as at least partly separated from each other, on the board. Consequently, an improvement in yield and a highly versatile image sensor and an image pickup apparatus using the same are realized. Further, the manufacturing method for manufacturing the image sensor can realize an improvement in yield and a highly versatile image sensor.

DESCRIPTION OF REFERENCES

Figure 1:
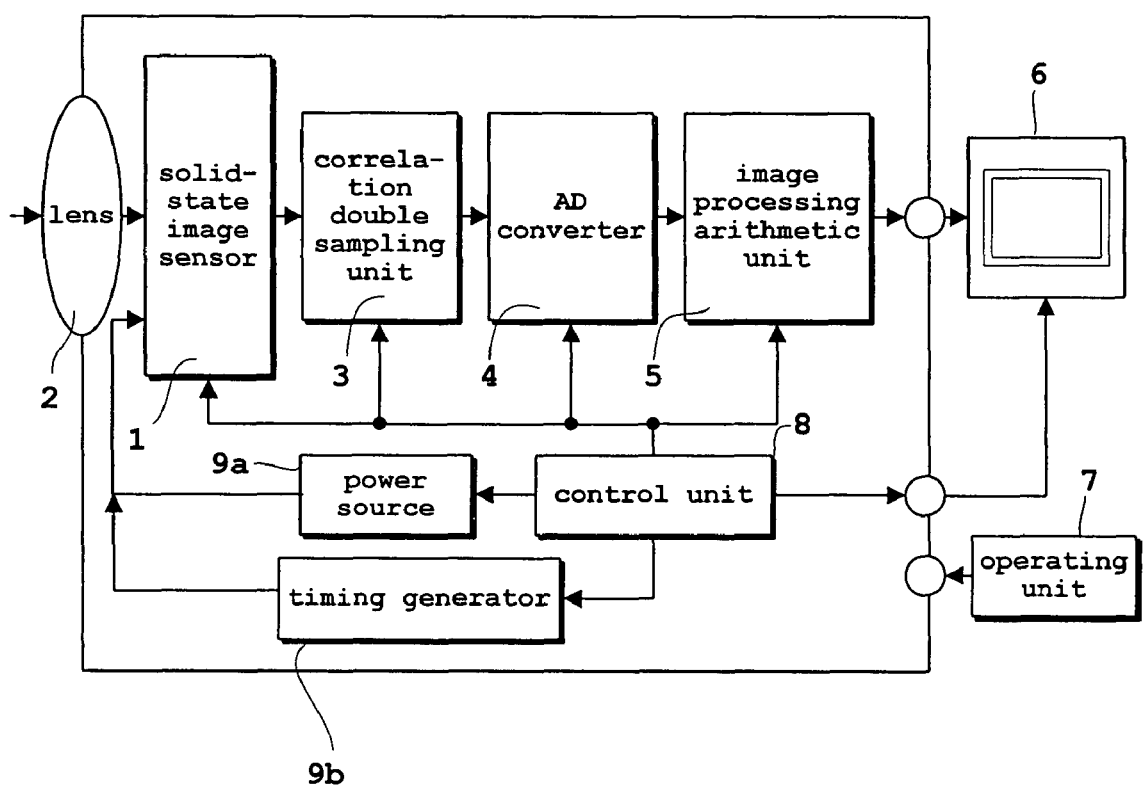
[FIG. 1]
Block diagram showing an outline of an imaging apparatus using a CCD type solid-state image sensor (CCD) according to Embodiment 1 or 2.

1 . . . solid-state image sensor (CCD)
11 . . . photogates
12 . . . storage CCD cells
14 . . . image pickup unit
15 . . . output unit
21 . . . input unit
22 . . . charge multiplier
23 . . . charge-to-voltage converter
40 . . . packaging board
41 . . . heat transfer substrates
42 . . . sensor chips
45 . . . heat radiation terminals

BEST MODE FOR CARRYING OUT THE INVENTION

By arranging an image pickup unit and a charge multiplier as separated from each other on a packaging board, the influence of either one of the image pickup unit and the charge multiplier on the other can be reduced. Thus, the object of realizing improved yield has been fulfilled. By arranging the image pickup unit and charge multiplier as separated from each other on the packaging board, the object of realizing a CCD type solid-state image sensor (CCD) and a photographic apparatus of high versatility has been fulfilled.

Embodiment 1

Figure 2:
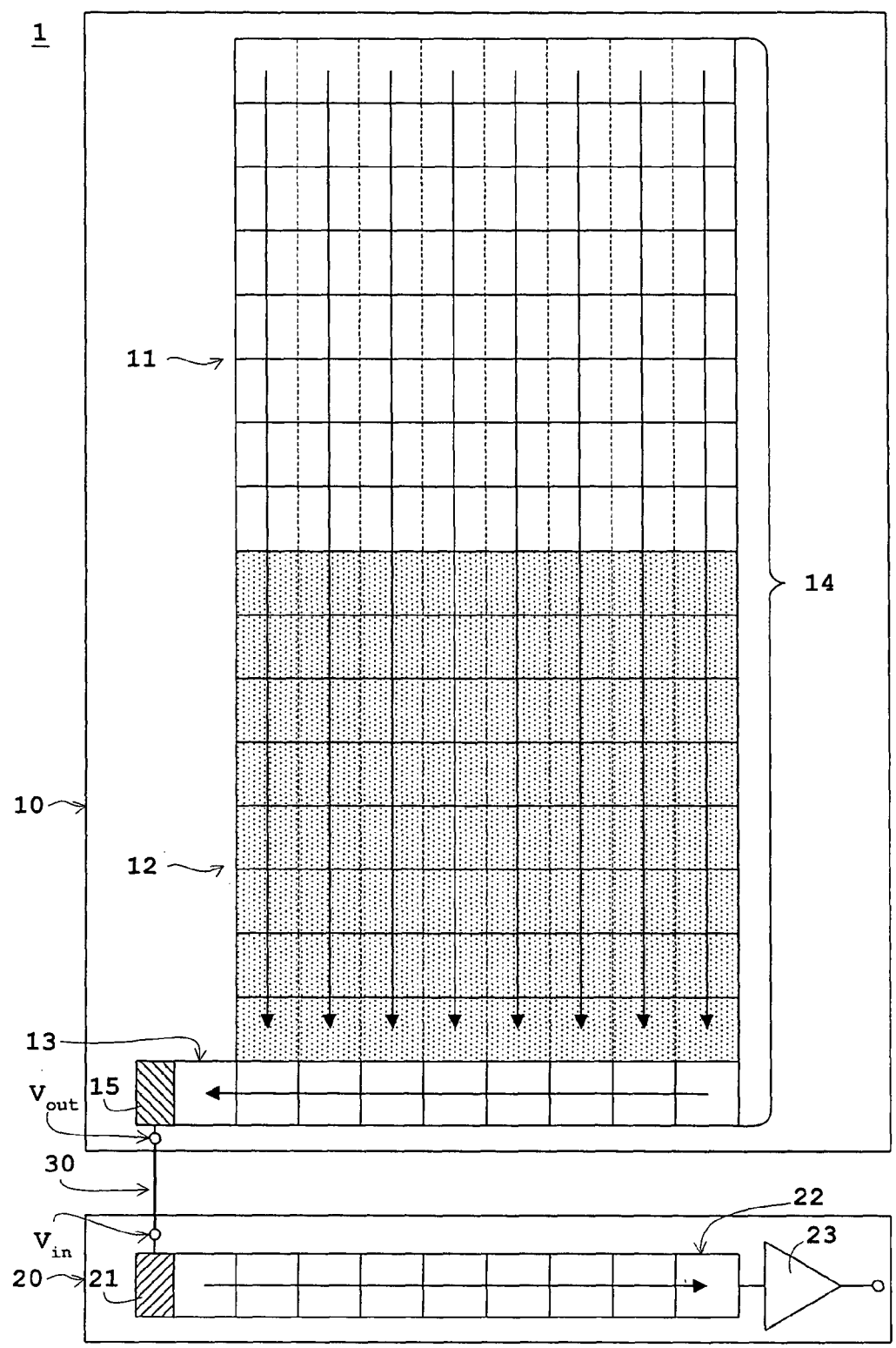
[FIG. 2]
Block diagram showing the construction of the CCD according to Embodiment 1.
Figure 3:
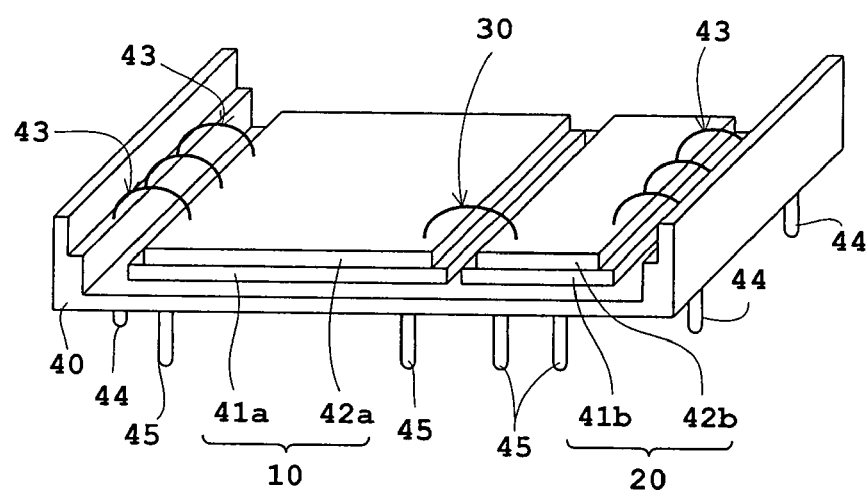
[FIG. 3]
Schematic perspective view showing the construction of the CCD according to Embodiment 1.
Figure 4:
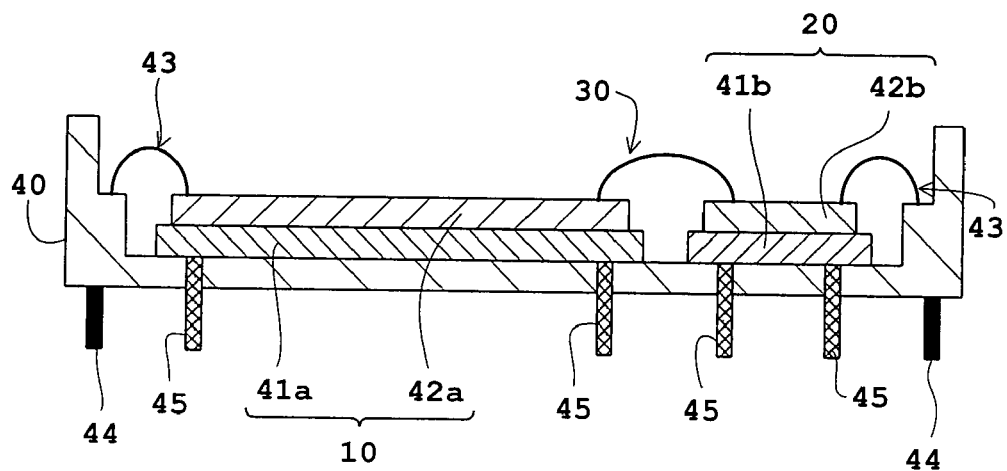
[FIG. 4]
Cross-section view showing the construction of the CCD according to Embodiment 1.

Embodiment 1 of this invention will be described hereinafter with reference to the drawings. FIG. 1 is a block diagram showing an outline of an image pickup apparatus using a CCD type solid-state image sensor (CCD) according to Embodiment 1. FIG. 2 is a block diagram showing the construction of the CCD. FIG. 3 is a schematic perspective view showing the construction of the CCD. FIG. 4 is a sectional view showing the construction of the CCD. In Embodiment 1, including Embodiment 2 described hereinafter, a CCD of the FT (Frame Transfer) mode will be described by way of example. In the FT mode, photogates are used as the photoelectric conversion device in this invention.

The image pickup apparatus according to Embodiment 1, including Embodiment 2 described hereinafter, is constructed to acquire optical images of an object, convert the acquired optical images into signal charges and into electric signals, thereby picking up images of the object. Specifically, as shown in FIG. 1, the image pickup apparatus includes a solid-state image sensor (CCD) 1, and includes a lens 2, a correlation double sampling unit 3, an AD converter 4, an image processing arithmetic unit 5, a monitor 6, an operating unit 7 and a control unit 8. Further, the image pickup apparatus includes a power source 9a and a timing generator 9b. The solid-state image sensor (CCD) 1 corresponds to the image sensor in this invention.

The lens 2 takes in optical images of the object. The correlation double sampling unit 3 amplifies signal charges from the CCD 1 to low noise, and outputs them as electric signals. The AD converter 4 converts the electric signals into digital signals. The image processing arithmetic unit 5 performs various types of arithmetic processing to create two-dimensional images of the object based on the electric signals digitized by AD converter 4. The monitor 6 outputs the two-dimensional images on a screen. The operating unit 7 performs various operations required for execution of imaging. The control unit 8 carries out an overall control of the entire apparatus according to controls such as photographing conditions set by the operating unit 7.

The power source 9a applies voltage to transfer electrodes for transferring the signal charges in the CCD 1. The timing generator 9b generates timing of voltage application, timing of imaging, clocks and so on.

As shown in FIG. 2, the CCD 1 includes photogates 11 for converting incident light (optical images of an object) into electric charges to generate signal charges corresponding to the intensity of the light, and storage CCD cells 12 for successively transferring the signal charges generated from the photogates 11, vertically as seen in the drawing of FIG. 2, to store the charges in adjoining cells. The photogates 11 are arranged two-dimensionally, and the storage CCD cells 12 are likewise arranged two-dimensionally. In Embodiment 1, including Embodiment 2 described hereinafter, the photogates 11 and storage CCD cells 12, respectively, are in a two-dimensional arrangement of 8×8 in a horizontal direction and a vertically direction as seen in the drawing of FIG. 2. The numbers of photogates 11 and storage CCD cells 12 in a two-dimensional arrangement are not limited to 8×8, but may be varied as appropriate according to design. The photogates 11 correspond to the photoelectric conversion devices in this invention. The storage CCD cells 12 correspond to the charge transfer devices in this invention.

The photogates 11 and storage CCD cells 12 are formed of the same photoelectric converters, and only the storage CCD cells 12 are light-shielded in order to prevent a contamination of noise due to incident light and its conversion into electric charges.

In Embodiment 1, including Embodiment 2 described hereinafter, eight transfer electrodes are arranged for the photogates 11, and eight transfer electrodes are arranged also for the storage CCD cells 12. Each photogate 11 and each storage CCD cell 12 are controlled by four-phase pulse drive, and four transfer electrodes control each photogate 11 and each storage CCD cell 12 for one pixel. A particular description about the pulse drive is omitted. The above four-phase pulse drive is not limitative, but, for example, two-phase, three-phase or five-phase pulse drive may be used.

Horizontal transfer CCD cells 13 are connected and arranged downstream of the storage CCD cells 12. The horizontal transfer CCD cells 13 transfer the signal charges transferred from the storage CCD cells 12, horizontally as seen in the drawing of FIG. 2. The horizontal transfer CCD cells 13 have transfer electrodes arranged therefor. These photogates 11, storage CCD cells 12 and horizontal transfer CCD cells 13 constitute an image pickup unit 14. The image pickup unit 14 corresponds to the image pickup device in this invention.

An output unit 15 is disposed downstream of the horizontal transfer CCD cells 13. The output unit 15 detects, and outputs as output voltages $V_{out}$, the signal charges generated from the photogates 11 and transferred through the storage and horizontal transfer CCD cells 12 and 13. The output unit 15 corresponds to the charge detecting device in this invention.

Output voltages $V_{out}$ are transferred to an input unit 21 by a bonding wire 30, and are inputted as input voltages $V_{in}$ with the same values as output voltages $V_{out}$. The input unit 21 converts the transferred output voltages $V_{out}$ (i.e. inputted input voltages $V_{in}$) back to signal charges. The input unit 21 corresponds to the voltage-to-charge conversion device in this invention.

A charge multiplier 22 is disposed as connected to the input unit 21. The charge multiplier 22 multiplies the converted signal charges. The charge multiplier 22 generates a high electric field region for charge multiplication, for example, and multiplies the signal charges by passage through the high electric field region when transferring the signal charges. The charge multiplier 22 corresponds to the charge multiplying device in this invention.

A charge-to-voltage converter 23 is disposed downstream of the charge multiplier 22. The charge-to-voltage converter 23 converts into voltages the electric charge multiplied by the charge multiplier 22. The converted voltages are fed to the correlation double sampling unit 3 shown in FIG. 1. The charge-to-voltage converter 23 corresponds to the charge-to-voltage conversion device in this invention.

The image pickup unit 14 including the output unit 15, and the charge multiplier 22 including the input unit 21 and charge-to-voltage converter 23, are arranged on a packaging board 40 (see FIGS. 3 and 4) as separated from each other as shown in FIGS. 2-4. As shown in FIGS. 3 and 4, an image pickup base 10 and a multiplication base 20 are mounted on the packaging board 40, respectively. As shown in FIG. 2, the image pickup unit 14 including the output unit 15 is mounted on the image pickup base 10, and the charge multiplier 22 including the input unit 21 and charge-to-voltage converter 23 on the multiplication base 20. Between the image pickup base 10 and multiplication base 20, the bonding wire 30 noted above is disposed to bridge the two bases 10 and 20. The bonding wire 30 connects the output unit 15 on the side of the image pickup unit 14 on the image pickup base 10, and the input unit 21 on the side of the charge multiplier 22 on the multiplication base 20. The packaging board 40 corresponds to the board in this invention.

As shown in FIGS. 3 and 4, the two bases 10 and 20 each include a heat transfer substrate 41 and a sensor chip 42 laminated thereon. That is, the image pickup base 10 includes a heat transfer substrate 41a and a sensor chip 42a, while the multiplication base 20 includes a heat transfer substrate 41b and a sensor chip 42b. The heat transfer substrates 41a and 41b are separated from each other, and the sensor chips 42a and 42b also are separated from each other. The image pickup unit 14 including the output unit 15 is mounted directly on the image pickup base 10, while the charge multiplier 22 including the input unit 21 and charge-to-voltage converter 23 is mounted directly on the multiplication base 20.

The two bases 10 and 20 have other bonding wires 43 arranged thereon, respectively, at sides opposite from the part where the bonding wire 30 is connected. And signal terminals 44 are electrically connected to the above bonding wires 43 for transmitting and receiving signals between the CCD 1 and the components other than the CCD 1 (e.g. the correlation double sampling unit 3, control unit 8, power source 9a and timing generator 9b shown in FIG. 1).

The heat transfer substrates 41a and 41b have heat radiation terminals 45 arranged in locations corresponding to the image pickup unit 14 including the output unit 15, and the charge multiplier 22 including the input unit 21 and charge-to-voltage converter 23, respectively. With these heat radiation terminals 45, even if heat is generated in positions of the sensor chips 42a and 42b corresponding to the image pickup unit 14 and charge-to-voltage converter 23, the heat is released from the heat radiation terminals 45 respectively through the heat transfer substrates 41a and 41b. Therefore, these heat transfer substrates 41a and 41b and heat radiation terminals 45 provide a heat isolation structure for thermally separating the image pickup unit 14 and charge multiplier 22 from each other.

Figure 5:
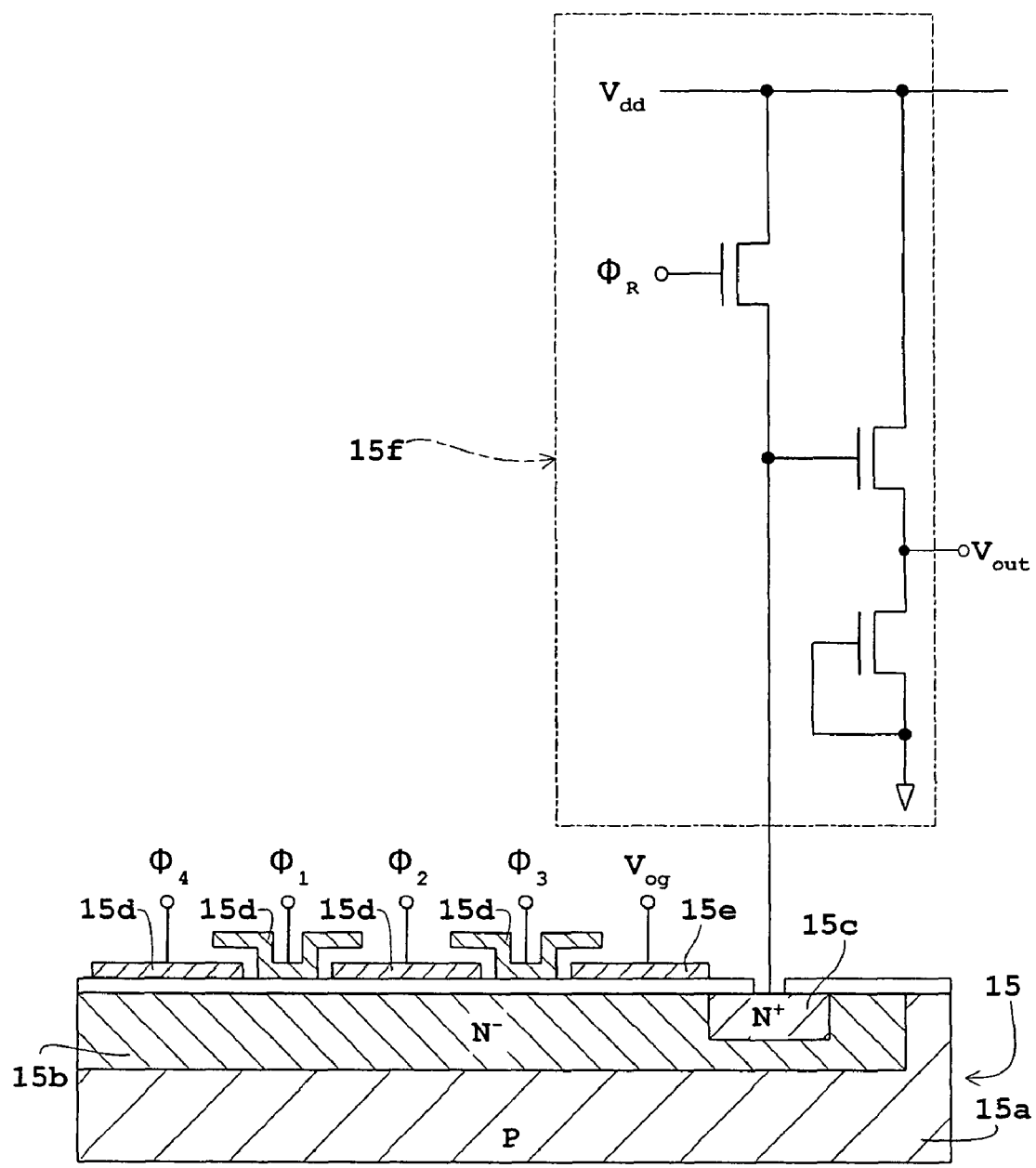
[FIG. 5]
Schematic view showing the construction of an output unit on the side of an image pickup unit of the CCD according to Embodiment 1.
Figure 6:
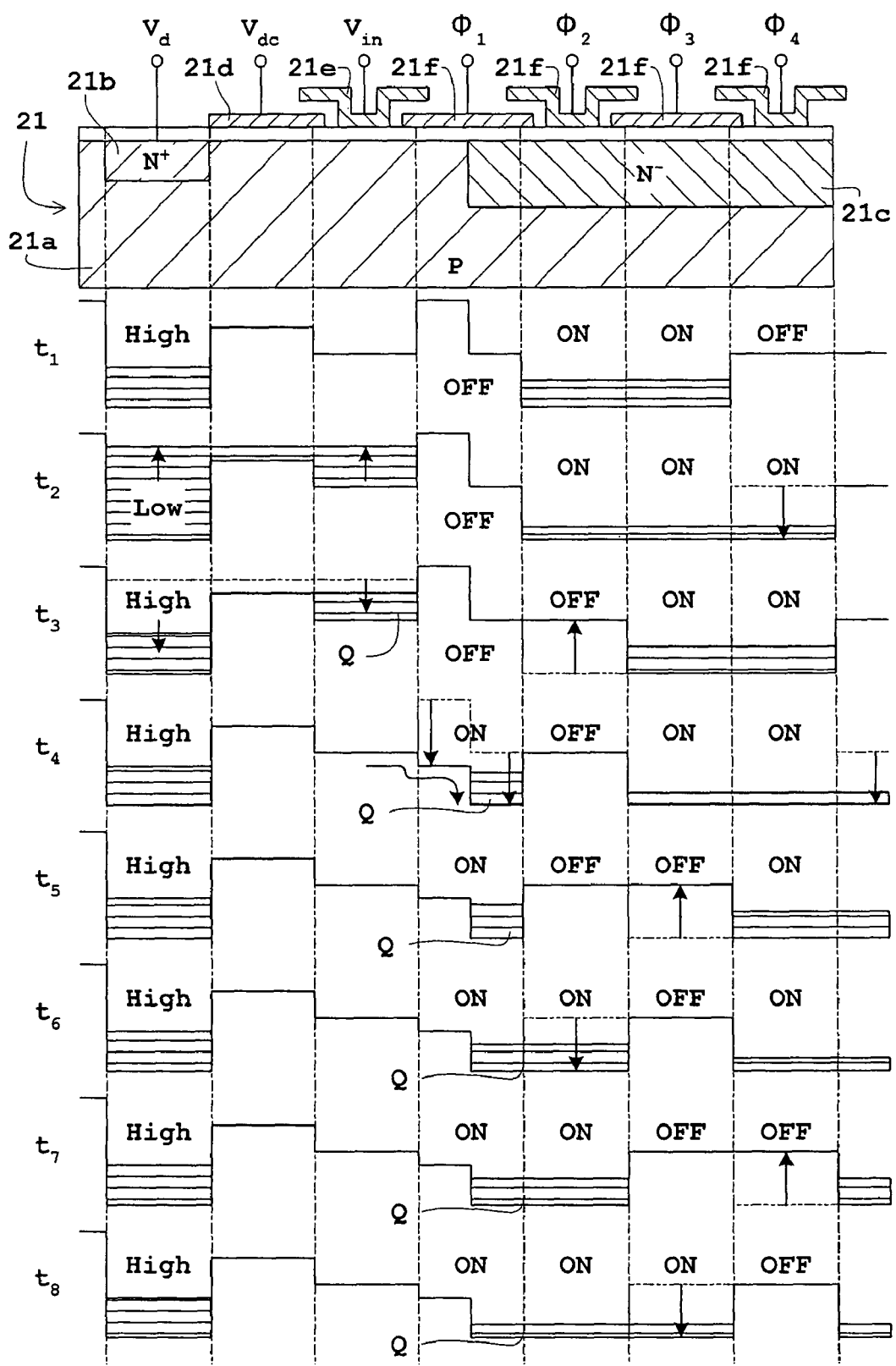
[FIG. 6]
Schematic view showing the construction of an output unit on the side of a charge multiplier of the CCD according to Embodiment 1, and view showing a potential of each location of the input unit.
Figure 7:
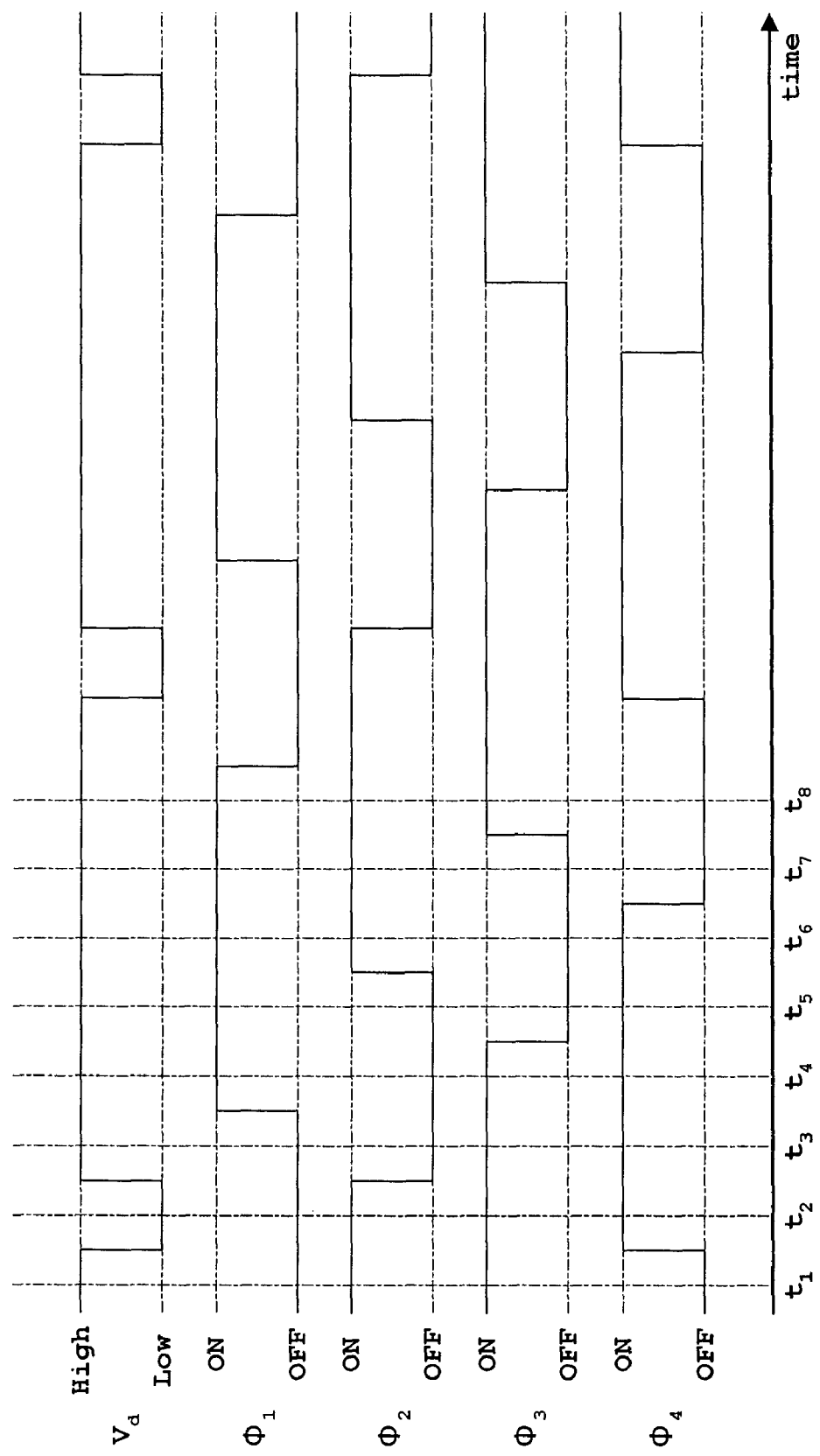
[FIG. 7]
Timing chart showing operation of the input unit.

Next, specific constructions of the output unit 15 and input unit 21 will be described with reference to FIGS. 5-7. FIG. 5 is a schematic view showing the construction of the output unit on the side of the image pickup unit of the CCD. FIG. 6 is a schematic view showing the construction of the input unit on the side of the charge multiplier of the CCD, and a view showing a potential of each location of the input unit. FIG. 7 is a timing chart showing operation of the input unit. The input unit and output unit in Embodiment 1 will be described by taking the four-phase pulse drive for example.

In Embodiment 1, the output unit 15 is formed of a detector called floating diffusion amplifier or FDA. As shown in FIG. 5, the output unit 15 includes a p-type silicon substrate 15a, an embedded channel 15b with N⁻ diffused therein, a charge injection diffusion layer (floating diffusion) 15c with N⁺ further diffused therein. Further, transfer gates 15d for impressing transfer electrodes $\Phi_1$, $\Phi_2$, $\Phi_3$ and $\Phi_4$ and an output gate 15e for impressing voltage $V_{og}$ are laminated. These gates 15d and 15e are formed of polysilicon. The charge injection diffusion layer 15c has, connected thereto, a source follower amplifier 15f having a reset voltage $\Phi_R$. A source voltage $V_{dd}$ is connected to each transistor in the source follower amplifier 15f.

The signal charges generated from the photogates 11 and transferred through the storage and horizontal transfer CCD cells 12 and 13 are transferred to the respective gates 15d of the transfer electrodes $\Phi_4$, $\Phi_1$, $\Phi_2$ and $\Phi_3$ in order, to be fed to the charge injection diffusion layer 15c. Before the feeding, the potential of the charge injection diffusion layer 15c is reset by the reset voltage $\Phi_R$. With these signal charges, the potential of the charge injection diffusion layer 15c changes. The changes in the potential of the charge injection diffusion layer 15c caused by the signal charges are proportional to the signal charges fed. The source follower amplifier 15f converts the potential changes into voltages and outputs them as output voltages $V_{out}$.

In Embodiment 1, the input unit 21 uses the potential balanced method considered to involve the least noise. As shown in FIG. 6, the input unit 21 includes a p-type silicon substrate 21a, a charge injection diffusion layer (floating diffusion) 21b with N⁺ diffused therein, and an embedded channel 21c with N⁻ diffused in the p-type silicon substrate 21a. A voltage $V_d$ is connected to the charge injection diffusion layer 21b. Further, a DC bias gate 21d for applying a DC bias voltage $V_{dc}$ maintained at fixed potential, an input gate 21e for applying an input voltage $V_{in}$ inputted with the same value as the output voltage $V_{out}$, and transfer gates 21f for impressing transfer electrodes $\Phi_1$, $\Phi_2$, $\Phi_3$ and $\Phi_4$, are laminated. These gates 21d, 21e and 21f are formed of polysilicon. In order to secure a sufficiently large allowance of potential, the bottoms of DC bias gate 21d and input gate 21e are surface channels, and the bottom of the transfer gate 21f for impressing the transfer electrode $\Phi_1$ is the embedded channel 21c from a halfway position.

In the timing shown in FIG. 7, when each of the voltage and electrodes $V_d$, $\Phi_1$, $\Phi_2$, $\Phi_3$ and $\Phi_4$ is controlled at times $t_1$-$t_8$, potentials will change in CCD wells as shown in FIG. 6.

In the charge injection diffusion layer 21b, the injection of charges changes according to the magnitude of voltage $V_d$. To the charge injection diffusion layer 21b to which a high voltage $V_d$ (marked "High" in FIGS. 6 and 7) was applied at time $t_1$, a low voltage $V_d$ (marked "Low" in FIGS. 6 and 7) is applied at time $t_2$, thus switching the voltage $V_d$ applied. With the application of this low voltage $V_d$, charges are injected under the DC bias gate 21d and input gate 21e. At this time, the low voltage is applied to the transfer gate 21f of transfer electrode $\Phi_1$ to place it in OFF state. Thus, it is blocked so that the injected charges may not leak to the transfer units of the transfer electrodes $\Phi_1$, $\Phi_2$, $\Phi_3$ and $\Phi_4$.

A high voltage $V_d$ is applied at time $t_3$ to the charge injection diffusion layer 21b to which the low voltage $V_d$ was applied at time $t_2$, and thus the voltage $V_d$ applied returns to high potential. With the return to high potential, excessive charges under the DC bias gate 21d and input gate 21e return to the charge injection diffusion layer 21b. The quantity of charges Q (see FIG. 6) substantially proportional to the potential difference between the DC bias gate 21d and input gate 21e, i.e. only the signal charges, remain under the input gate 21e.

At time $t_4$, a high voltage is applied to the transfer gate 21f of the transfer electrode $\Phi_1$, to switch it to ON state. The signal charges Q present under the input gate 21e are transferred under the transfer gate 21f. At and after time $t_5$, the charges are transferred successively to the transfer gates 21f of the transfer electrodes $\Phi_2$, $\Phi_3$ and $\Phi_4$ by the usual four-phase pulse drive. In this way, the input unit 21 converts the input voltages $V_{in}$ back into signal charges.

In the input unit 21 using this potential balanced method, since the charge injecting operation and transfer operation are performed at a speed higher than the Nyquist frequency of the frequency of input voltages $V_{in}$, the input voltages $V_{in}$ can be transferred accurately.

The output unit 15 and input unit 21 are not limited to the above four-phase pulse drive. The output unit 15 and input unit 21 operate synchronously with the photogates 11 and storage CCD cells 12. If it is the same drive method as for the photogates 11 and storage CCD cells 12, for example, when the photogates 11 and storage CCD cells 12 are operated by two-phase pulse drive, the same two-phase pulse drive may be used. The same applies to the three-phase or five-phase pulse drive.

According to the CCD 1 and the image pickup apparatus using the same described above, the image pickup unit 14 and charge multiplier 22 are arranged as separated from each other on the packaging board 40. This reduces the influence of one of the image pickup unit 14 and charge multiplier 22 on the other. Therefore, an improvement in yield can be realized. With the image pickup unit 14 and charge multiplier 22 arranged as separated from each other on the packaging board 40, the CCD 1 and the image pickup apparatus are highly versatile also when a design change is made in one of the image pickup unit 14 and charge multiplier 22.

In Embodiment 1, the heat transfer substrates 41a and 41b and heat radiation terminals 45 provide a heat isolation structure for thermally separating the image pickup unit 14 and charge multiplier 22 from each other. With such heat isolation structure, even when a temperature change occurs with the image pickup unit 14, the heat isolation structure can reduce the influence of the image pickup unit 14 on the charge multiplier 22. Therefore, charge multiplication gain sensitive to temperature changes is stabilized to improve reproducibility of a photo image and reproducibility of a profile. When performing high-speed photography at a photographing speed of $1.0 \times 10^6$ frames per second (1,000,000 frames per second), for example, even when the board is subjected to a remarkable temperature rise by driving the CCD at high speed, such heat isolation structure can reduce the influence of the image pickup unit 14 on the charge multiplier 22. Therefore, Embodiment 1 is especially useful when performing high-speed photography.

In Embodiment 1, the image pickup unit 14 and charge multiplier 22 are mounted as completely separated from each other on the packaging board 40. Thus, thermal separation by the heat isolation structure can be demonstrated with increased effect, compared with the case, as in Embodiment 2 described hereinafter, where the image pickup unit 14 and charge multiplier 22 are mounted as partly separated from each other on the packaging board 40.

Embodiment 1 has been described by taking for example the CCD type solid-state image sensor with the image pickup unit 14 including the photogates 11 for converting incident light into electric charges to generate signal charges corresponding to the intensity of the light, and the storage CCD cells 12 for transferring the signal charges generated from the photogates 11.

Where such signal charges are used as output form, and when the image pickup unit 14 and charge multiplier 22 are completely separated as in Embodiment 1, it is difficult to transfer in the output form of signal charges. Thus, Embodiment 1 has the output unit 15 which detects the signal charges generated from the photogates 11, and outputs them as output voltages $V_{out}$. The above voltages are transferred through the bonding wire 30 between the image pickup unit 14 and charge multipliers 22. And the input unit 21 is disposed between the image pickup unit 14 and charge multiplier 22, and the input unit 21 converts the transferred output voltages $V_{out}$ (that is, inputted input voltages $V_{in}$) into electric charges. After converting into electric charges, the charge multiplier 22 multiplies the signal charges, and the charge-to-voltage converter 23 converts them into voltages. Thus, even if completely separated, the output form of voltages converted from the charges can be transferred in a simple way.

In Embodiment 1, as described above, the image pickup unit 14 and charge multiplier 22 are mounted as completely separated from each other on the packaging board 40. In Embodiment 2 shown below, the image pickup unit 14 and charge multiplier 22 are mounted as partly separated from each other on the packaging board 40.

Embodiment 2

Figure 8:
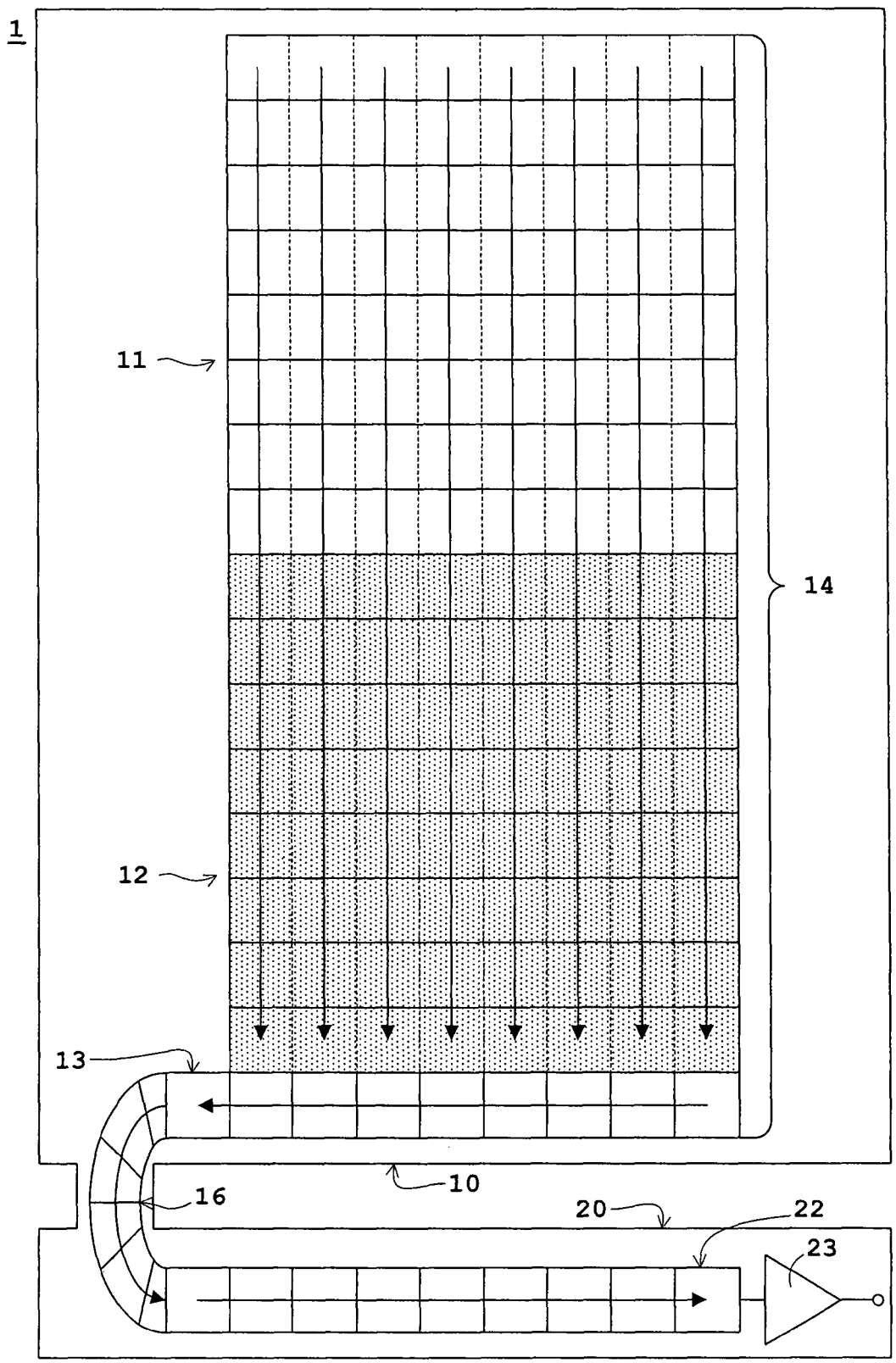
[FIG. 8]
Block diagram showing the construction of the CCD according to Embodiment 2.
Figure 9:
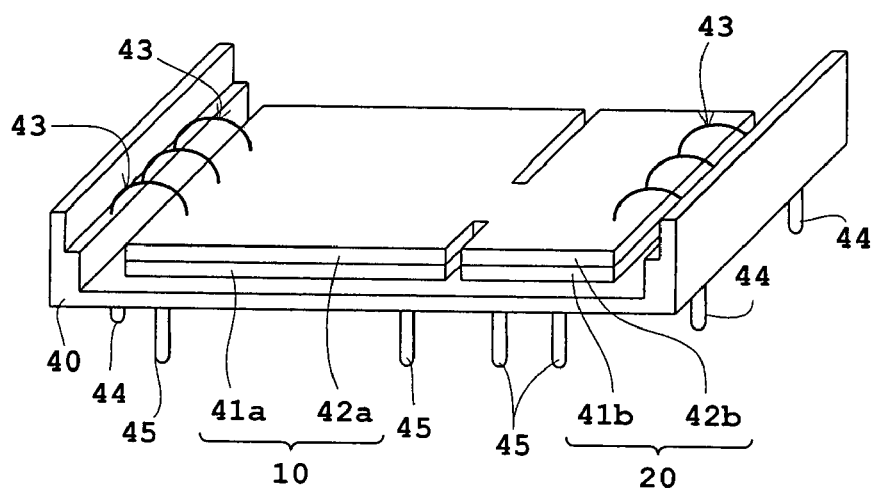
[FIG. 9]
Schematic perspective view showing the construction of the CCD according to Embodiment 2.
Figure 10:
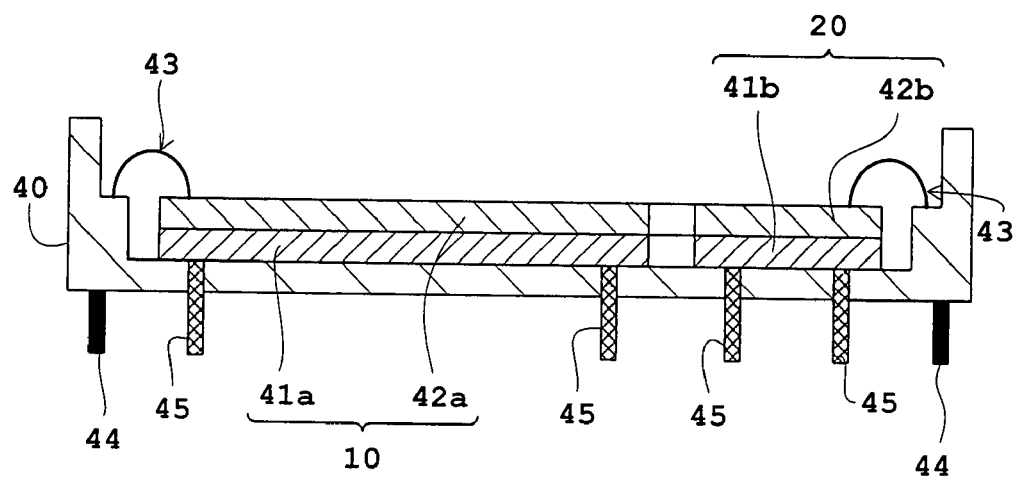
[FIG. 10]
Sectional view showing the construction of the CCD according to Embodiment 2.

Embodiment 2 of this invention will be described hereinafter with reference to the drawings. FIG. 8 is a block diagram showing the construction of the CCD according to Embodiment 2. FIG. 9 is a schematic perspective view showing the construction of the CCD. FIG. 10 is a sectional view showing the construction of the CCD. Parts common to those of the foregoing Embodiment 1 are shown with the same reference numbers, and are not described again.

Figure 15:
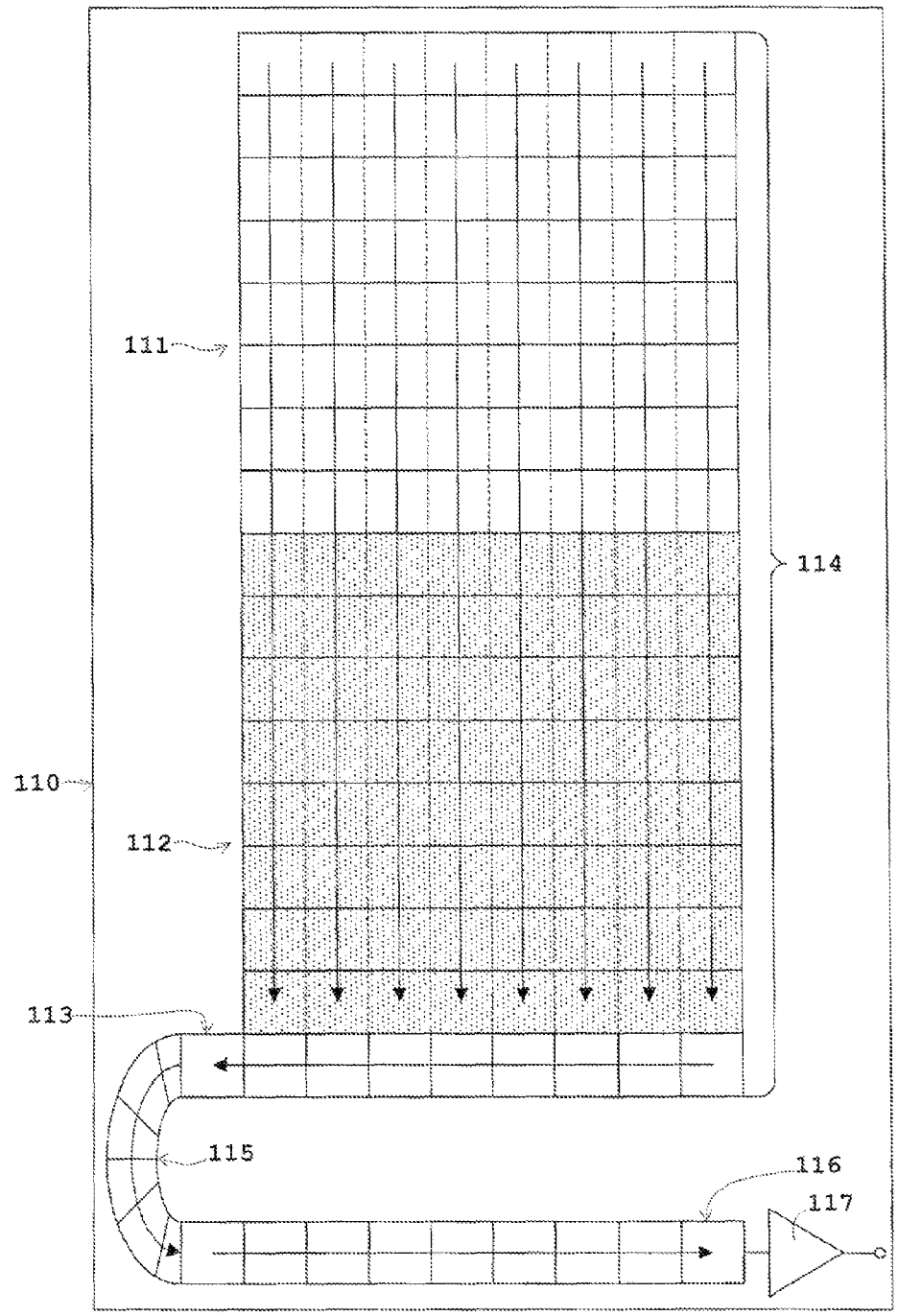
[FIG. 15]
Block diagram showing a construction of a conventional CCD.

As shown in FIG. 8, the CCD 1 according to Embodiment 2, as in Embodiment 1, has an image pickup unit 14 including photogates 11, storage CCD cells 12 and horizontal transfer CCD cells 13, and has also a charge multiplier 22 and a charge-to-voltage converter 23. A difference from Embodiment 1 lies in that, in place of the output unit 15, bonding wire 30 and input unit 30 of Embodiment 1, Embodiment 2 has a plurality of coupling CCD cells 16 arranged and connected in series between the horizontal transfer CCD cells 13 and charge multiplier 22. The coupling CCD cells 16 correspond to the coupling CCD cells 115 in the prior art in FIG. 15. A difference from Embodiment 1 lies also in that, in Embodiment 1, the image pickup unit 14 and charge multiplier 22 are mounted as completely separated from each other on the packaging board 40, whereas the image pickup unit 14 and charge multiplier 22 herein are mounted as partly separated from each other on the packaging board 40.

Each of the coupling CCD cells 16 is constructed to bridge the horizontal transfer CCD cells 13 and charge multiplier 22, and is arranged in a location of connection between the image pickup unit 14 and charge multiplier 22 remaining by separating parts of the image pickup unit 14 and charge multiplier 22. The coupling CCD cells 16 transfer the signal charges generated from the photogates 11 and transferred through the storage and horizontal transfer CCD cells 12 and 13, successively in the direction of an arrow in FIG. 8, and feed them into the charge multiplier 22. That is, in Embodiment 2, as distinct from Embodiment 1, the signal charges are transferred as they are between the image pickup unit 14 and charge multipliers 22 by the coupling CCD cells 16. And the transferred signal charges are converted into voltages by the charge-to-voltage converter 23. Thus, the charges can be transferred in the same form (signal charges), without being converted until they are transferred to the charge-to-voltage converter 23.

With the transfer in the same form, Embodiment 2 is free from reset noise mixing in when the charges are converted into voltages as in Embodiment 1. Consequently, noise can be reduced, compared with Embodiment 1.

In Embodiment 2, the image pickup unit 14 including the output unit 15, and the charge multiplier 22 including the input unit 21 and charge-to-voltage converter 23, are arranged on the packaging board 40 (see FIGS. 9 and 10) as partly separated from each other as shown in FIGS. 8-10. As in Embodiment 1, an image pickup base 10 and a multiplication base 20 are mounted on the packaging board 40, respectively. As distinct from Embodiment 1, the image pickup base 10 and multiplication base 20 also are partly separated from each other. That is, the heat transfer substrate 41a forming the image pickup base 10 and the heat transfer substrate 41b forming the multiplication base 20 also are partly separated from each other, and the sensor chip 42a forming the image pickup base 10 and the sensor chip 42b forming the multiplication base 20 also are partly separated from each other.

As in Embodiment 1, the heat transfer substrates 41a and 41b have heat radiation terminals 45 arranged in locations corresponding to the image pickup unit 14 including the output unit 15, and the charge multiplier 22 including the input unit 21 and charge-to-voltage converter 23, respectively.

Figure 11:
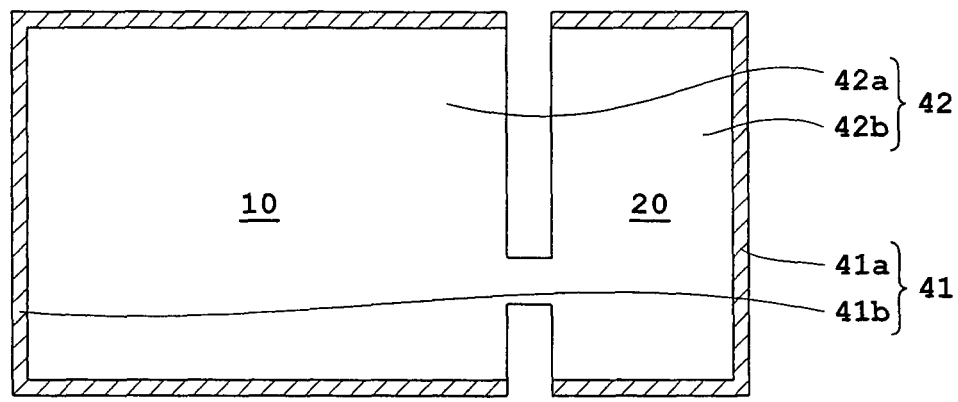
[FIG. 11]
Plan view showing a form of partial separation.
Figure 12:
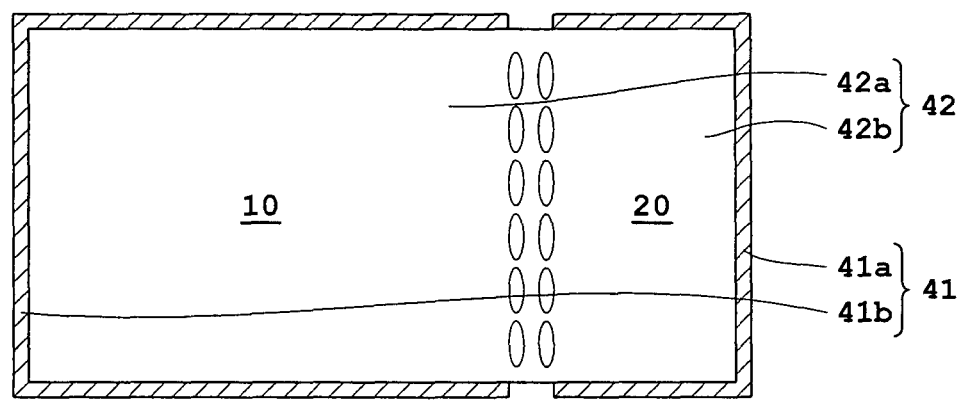
[FIG. 12]
Plan view showing a form of partial separation.
Figure 13:
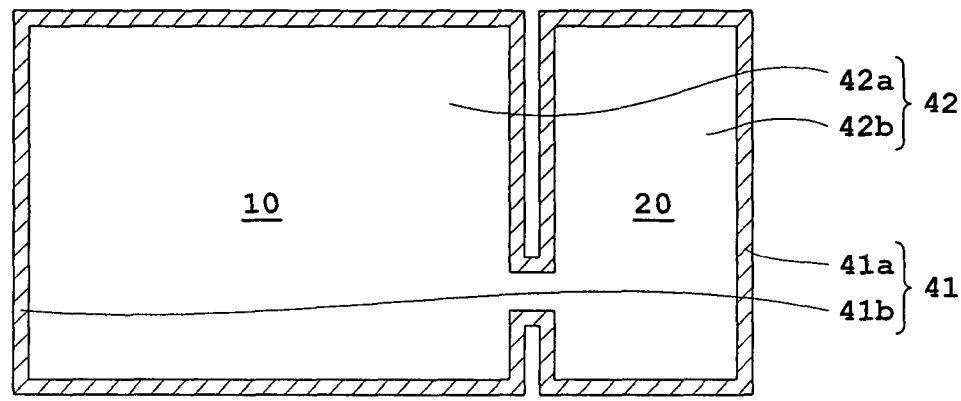
[FIG. 13]
Plan view showing a form of partial separation.

In the form of separation, as shown in FIGS. 8-10, a region other than ends may serve as a part of connection between the image pickup unit 14 and charge multiplier 22, with the remainder being separated. As shown in FIG. 11, a separation may be made such that the heat transfer substrates 41 protrude from the sensor chips 42, respectively. As shown in FIG. 12, a separation may be made by providing numerous bores in the location of separation. As shown in FIG. 13, a separation may be made such that, without separating the heat transfer substrates 41a and 41b, the sensor chips 42 are reinforced with the heat transfer substrates 41.

When manufacturing the CCD 1 having the image pickup unit 14 and charge multiplier 22 partly separated from each other as in Embodiment 2, it is preferable to manufacture it by the method shown in the following FIG. 14. FIGS. 14(a)-14(c) are perspective views each showing a step of manufacturing the CCD according to Embodiment 2.

When manufacturing the CCD 1, the sensor chips 42 are laminated on the heat transfer substrates 41, and the heat transfer substrates 41 and sensor chips 42 in the laminated state are laminated on the packaging board 40. It is therefore conceivable to use a technique of laminating the sensor chips 42 on the heat transfer substrates 41 after shaping the sensor chips 42 by anisotropic etching, cutting with a laser or dicing to the shape shown in FIGS. 8-10. According to this technique, the sensor chips 42 are laminated on the heat transfer substrates 41 after being shaped in advance. Thus, there is a possibility that the sensor chips 42 are damaged when the shaped sensor chips 42 are laminated on the heat transfer substrates 41.

Figure 14:
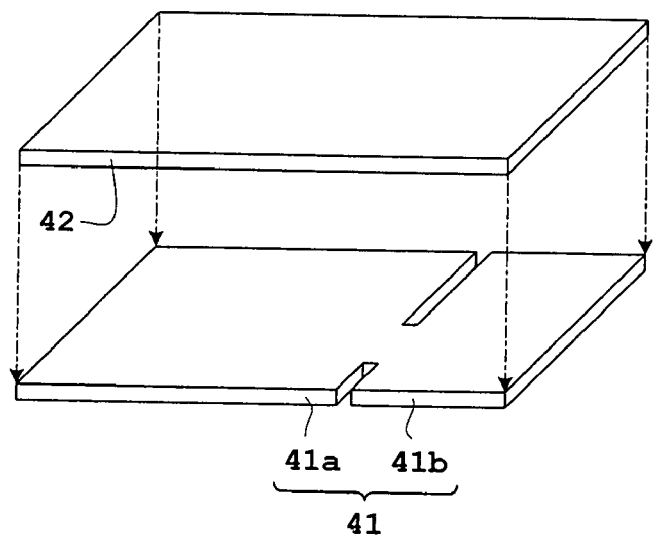
[FIG. 14]
($a$)-($c$) are perspective views each showing a step of manufacturing the CCD according to Embodiment 2.
Figure 14:
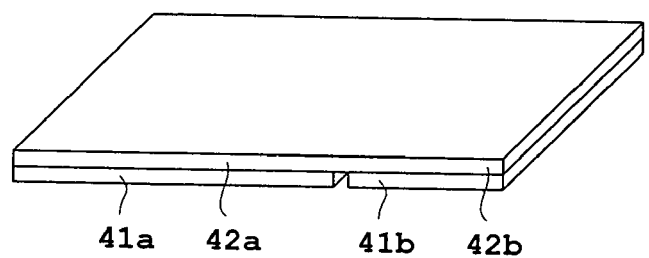
Figure 14:
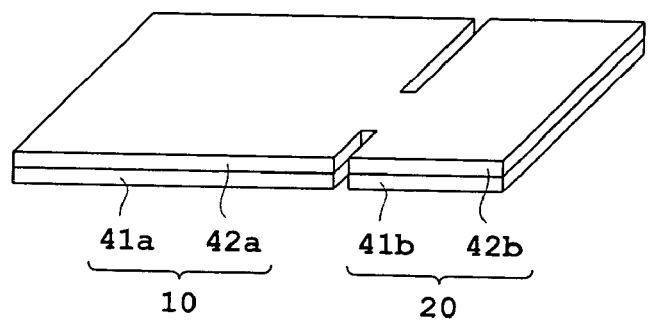

Then, the CCD 1 is manufactured in the procedure shown in FIGS. 14(a)-14(c). The packaging board 40 is not shown in each drawing of FIG. 14. First, as shown in FIGS. 14(a) and 14(b), the sensor chips 42 are laminated on the heat transfer substrates 41. After the lamination, the heat transfer substrates 41 are shaped as above in the location corresponding to the part between the image pickup unit 14 and charge multiplier 22 (see FIG. 14(c)). The shaping process may be carried out by combining, as appropriate, the above anisotropic etching, cutting with a laser, and dicing. The heat transfer substrates 41 correspond to the first plat-like member in this invention. The sensor chips 42 correspond to the second plate-like member in this invention.

The heat radiation terminals 45 shown in FIGS. 9 and 10 are formed on the heat transfer substrates 41a and 41b in locations corresponding to the image pickup unit 14 and charge multiplier 22 to be separated. Even if heat is generated in locations of the sensor chips 42a and 42b corresponding to the image pickup unit 14 and charge-to-voltage converter 23, the heat is released from the heat radiation terminals 45 respectively through the heat transfer substrates 41a and 41b. Thus, these heat transfer substrates 41a and 41b and heat radiation terminals 45 provide a heat isolation structure for thermally separating the image pickup unit 14 and charge multiplier 22 from each other. The heat radiation terminals 45 correspond to the heat radiation members in this invention.

While providing the heat radiation terminals, a photolithographic process is carried out on the sensor chips 42 for the image pickup unit 14 and charge multiplier 22, circuit patterns of the image pickup unit 14 and charge multiplier 22 are formed, and bonding is carried out to connect the respective circuits electrically. The heat transfer substrates 41 and sensor chips 42 after the shaping process are laminated on the packaging board 40 to complete the process. The heat radiation terminals and circuit pattern formation need not be carried out in a particular order.

The CCD 1 according to Embodiment 2 can be realized by the manufacture method shown in FIGS. 14(a)-14(c). The sensor chips 42 are shaped in the state of the sensor chips 42 laminated on the heat transfer substrates 41. This prevents damage of the sensor chips 42 occurring when the sensor chips 42 are laminated on the heat transfer substrates 41, compared with the case of laminating the heat transfer substrate 41 after shaping the sensor chips 42 in advance.

This invention is not limited to the foregoing embodiments, but may be modified as follows:

(1) In Embodiments 1 and 2 described above, the photogates have been described as an example of photoelectric conversion devices. This is not limitative. For example, photodiodes may be used as the photoelectric conversion devices.

(2) In Embodiments 1 and 2 described above, the heat transfer substrates and heat radiation terminals provide a heat isolation structure. Without the heat isolation structure, the image pickup device represented by the image pickup unit and the charge multiplication device represented by the charge multiplier may simply be separated from each other.

(3) As in Embodiment 1 described above, the image pickup device represented by the image pickup unit and the charge multiplication device represented by the charge multiplier may be mounted, as completely separated from each other, on the board represented by the packaging board. As in Embodiment 2, the image pickup device and charge multiplication device may be mounted, as partly separated from each other, on the board. That is, the image pickup device and charge multiplication device may be mounted, as at least partly separated from each other, on the board.

(4) In Embodiments 1 and 2 described above, the image pickup device represented by the image pickup unit is a CCD type solid-state image sensor including the charge transfer devices represented by the photogates and the photoelectric conversion devices represented by the storage CCD cells, for outputting signal charges corresponding to the intensity of light. This may be replaced by a CMOS type solid-state image sensor for converting incident light into voltages to output voltages corresponding to the intensity of the light.

In the case of CMOS, as in Embodiment 1, the image pickup device and the charge multiplication device may be mounted, as completely separated from each other, on the board, with voltages transferred by a bonding wire similar to the one in Embodiment 1, and converted into charges by an input unit (voltage-to-charge conversion device) similar to the one in Embodiment 1. Since the output form is voltages in the case of CMOS, the output unit (charge detecting device) described in Embodiment 1 for detecting signal charges and outputted them as voltages is unnecessary. An output portion of the CMOS may be electrically connected directly to the bonding wire, for example.

(5) In Embodiment 2 described above, in order to prevent damage done to the sensor chips 42 when the sensor chips 42 are laminated on the heat transfer substrates 41, the sensor chips 42 are shaped in the state of the sensor chips 42 laminated on the heat transfer substrates 41. Where there is no possibility of damage, the sensor chips 42 may be shaped before laminating the sensor chips 42 on the heat transfer substrates 41, and the image pickup device represented by the image pickup unit and the charge multiplication device represented by the charge multiplier may be partly separated from each other.

(6) This invention may be suited also to any image pickup modes. The image pickup modes include, mainly, IL (Interline) mode, FT (Frame Transfer) mode, FFT (Full Frame Transfer) mode and FIT (Frame Interline Transfer) mode. The structure of the image sensor also varies according to these modes. The image pickup device and the charge multiplication device may be constructed in accordance with such variations.

INDUSTRIAL UTILITY

As described above, this invention is suitable for a CCD type solid-state image sensor and a CMOS type solid-state image sensor.

The invention claimed is:

1. An image sensor for picking up images, comprising an image pickup device for picking up images based on incident light, a charge-to-voltage conversion device for converting signal charges corresponding to intensity of the incident light into voltages, and a charge multiplication device disposed between said image pickup device and said charge-to-voltage conversion device for multiplying the signal charges, characterized in that the image pickup device is mounted on an image pickup base and said charge multiplication device is mounted on a multiplication base, the image pickup base and the multiplication base being mounted at least partly separated from each other on a board.

2. An image sensor as defined in claim 1, characterized in that a heat isolation structure is provided for thermally separating said image pickup device and said charge multiplication device from each other.

3. An image sensor as defined in claim 1, characterized in that said image pickup device includes photoelectric conversion devices for converting the incident light into charges to generate signal charges corresponding to the intensity of the light, and charge transfer devices for transferring the signal charges generated from the photoelectric conversion devices.

4. An image sensor as defined in claim 3, characterized in that a charge detecting device is provided for detecting and outputting as voltages said signal charges generated from said photoelectric conversion devices, and a voltage-to-charge conversion device is provided for transferring said voltages between said image pickup device and said charge multiplication device, and converting into charges the voltages transferred between the image pickup device and the charge multiplication device.

5. An image sensor as defined in claim 3, characterized in that said signal charges are transferred between said image pickup device and said charge multiplication device.

6. An image sensor as defined in claim 3, characterized in that said sensor is a CCD type solid-state image sensor for converting the incident light into charges to generate and transfer signal charges corresponding to the intensity of the light.

7. An image sensor as defined in claim 1, characterized in that said image pickup device is constructed for converting the incident light into voltages to generate voltages corresponding to the intensity of the light, and a voltage-to-charge conversion device is provided for transferring said voltages between said image pickup device and said charge multiplication device, and converting into charges the voltages transferred between the image pickup device and the charge multiplication device.

8. An image sensor as defined in claim 7, characterized in that said sensor is a CMOS type solid-state image sensor for converting the incident light into voltages to generate voltages corresponding to the intensity of the light.

9. An image pickup apparatus using an image sensor, characterized in that the image sensor comprises an image pickup device for picking up images based on incident light, a charge-to-voltage conversion device for converting signal charges corresponding to intensity of the incident light into voltages, and a charge multiplication device disposed between said image pickup device and said charge-to-voltage conversion device for multiplying the signal charges, the image pickup device is mounted on an image pickup base and said charge multiplication device is mounted on a multiplication base, the image pickup base and the multiplication base being mounted at least partly separated from each other on a board.

10. An image pickup apparatus as defined in claim 9, characterized in that said sensor has a heat isolation structure for thermally separating said image pickup device and said charge multiplication device from each other.

11. An image pickup apparatus as defined in claim 9, characterized in that said image pickup device includes photoelectric conversion devices for converting the incident light into charges to generate signal charges corresponding to the intensity of the light, and charge transfer devices for transferring the signal charges generated from the photoelectric conversion devices.

12. An image pickup apparatus as defined in claim 11, characterized in that said sensor comprises a charge detecting device for detecting and outputting as voltages said signal charges generated from said photoelectric conversion devices, and a voltage-to-charge conversion device for transferring said voltages between said image pickup device and said charge multiplication device, and converting into charges the voltages transferred between the image pickup device and the charge multiplication device.

13. An image pickup apparatus as defined in claim 11, characterized in that said signal charges are transferred between said image pickup device and said charge multiplication device.

14. An image pickup apparatus as defined in claim 9, characterized in that said image pickup device is constructed for converting the incident light into voltages to generate voltages corresponding to the intensity of the light, and said sensor comprises a voltage-to-charge conversion device for transferring said voltages between said image pickup device and said charge multiplication device, and converting into charges the voltages transferred between the image pickup device and the charge multiplication device.

15. A manufacturing method for manufacturing an image sensor having an image pickup device for picking up images based on incident light, and a charge-to-voltage conversion device for converting signal charges corresponding to intensity of the incident light into voltages, and having a charge multiplication device disposed between said image pickup device and said charge-to-voltage conversion device for multiplying the signal charges, said manufacturing method for manufacturing an image sensor being characterized by laminating, on a first plate-like member, a second plate-like member for forming the image pickup device and the charge multiplication device, shaping said second plate-like member in a location corresponding to a part between the image pickup device and the charge multiplication device after the lamination to separate partly the image pickup device and said charge multiplication device, and laminating the first and second plate-like members after the shaping of the second plate-like member on a board for providing said sensor.

16. A manufacturing method for manufacturing an image sensor as defined in claim 15, characterized in that said first plate-like member is a heat transfer substrate, with heat radiation members being formed in each of locations of said heat transfer substrate corresponding to said image pickup device and said charge multiplication device to be separated, to provide a heat isolation structure for thermally separating the image pickup device and the charge multiplication device from each other.

17. A manufacturing method for manufacturing an image sensor having an image pickup device for picking up images based on incident light, and a charge-to-voltage conversion device for converting signal charges corresponding to intensity of the incident light into voltages, and having a charge multiplication device disposed between said image pickup device and said charge-to-voltage conversion device for multiplying the signal charges, said manufacturing method for manufacturing an image sensor being characterized in that, before laminating, on a first plate-like member, a second plate-like member for forming the image pickup device and the charge multiplication device, said second plate-like member is shaped in a location corresponding to a part between the image pickup device and the charge multiplication device to separate partly the image pickup device and said charge multiplication device, laminating the shaped second plate-like member on said first plate-like member after the shaping of the second plate-like member, and laminating the first and second plate-like members after the lamination, on a board for providing said sensor.

18. A manufacturing method for manufacturing an image sensor as defined in claim 17, characterized in that said first plate-like member is a heat transfer substrate, with heat radiation members being formed in each of locations of said heat transfer substrate corresponding to said image pickup device and said charge multiplication device to be separated, to provide a heat isolation structure for thermally separating the image pickup device and the charge multiplication device from each other.

* * * * *